US011133648B2

(12) United States Patent
Yen et al.

(10) Patent No.: US 11,133,648 B2
(45) Date of Patent: Sep. 28, 2021

(54) LASER MODULE

(71) Applicant: CONARY ENTERPRISE CO., LTD., Taipei (TW)

(72) Inventors: Hsien-Cheng Yen, Taipei (TW); Wen-Wei Lin, Taipei (TW); Ching-Hui Lin, Taipei (TW)

(73) Assignee: Conary Enterprise Co., Ltd., Taipei (TW)

( * ) Notice: Subject to any disclaimer, the term of this patent is extended or adjusted under 35 U.S.C. 154(b) by 35 days.

(21) Appl. No.: 16/697,557

(22) Filed: Nov. 27, 2019

(65) Prior Publication Data

US 2020/0244035 A1    Jul. 30, 2020

(30) Foreign Application Priority Data

Jan. 25, 2019  (TW) .................................. 108201204

(51) Int. Cl.

| *H01S 5/0683* | (2006.01) |
|---|---|
| *H01S 5/02208* | (2021.01) |
| *H01S 5/22* | (2006.01) |
| *H01S 5/042* | (2006.01) |
| *H01S 5/0687* | (2006.01) |
| *H01S 5/02253* | (2021.01) |
| *H01S 5/02255* | (2021.01) |
| *H01S 5/00* | (2006.01) |
| *H01S 5/02325* | (2021.01) |

(52) U.S. Cl.
CPC ........ *H01S 5/0683* (2013.01); *H01S 5/02208* (2013.01); *H01S 5/02253* (2021.01); *H01S 5/02255* (2021.01); *H01S 5/02325* (2021.01); *H01S 5/0427* (2013.01); *H01S 5/04256* (2019.08); *H01S 5/0687* (2013.01); *H01S 5/22* (2013.01); *H01S 5/005* (2013.01)

(58) Field of Classification Search
CPC ............. H01S 5/02325; H01S 5/04256; H01S 5/02255; H01S 5/02253; H01S 5/02208; H01S 5/0427; H01S 5/0687; H01S 5/22; H01S 5/022; H01S 5/02212; H01S 5/0683
USPC ...................................... 372/50.22
See application file for complete search history.

(56) References Cited

U.S. PATENT DOCUMENTS

2015/0377696 A1* 12/2015 Shpunt .................. G01S 7/4812
250/216

* cited by examiner

*Primary Examiner* — Tuan N Nguyen
(74) *Attorney, Agent, or Firm* — Rosenberg, Klein & Lee

(57) ABSTRACT

A laser module, comprising: a loading board; an edge emitting laser component arranged on the loading board, and the edge emitting laser component emits a first laser beam; a reflecting component arranged in front of the edge emitting laser component on the loading board for the first laser beam to be reflected vertically, and the edge emitting laser component and reflecting component become a laser emitting module; and a laser receiving module arranged closed to the edge emitting laser component on the loading board to receive the first laser beam reflected from above.

10 Claims, 9 Drawing Sheets

LASER MODULE

BACKGROUND OF THE INVENTION

1. Field of the Invention

The present invention relates to a laser module integrates the edge emitting laser component, the reflecting component, and the laser receiving module on a loading board.

2. Description of the Related Art

For emitting laser vertically on the integrated circuit board, the conventional TO-CAN package laser diode has the disadvantages of high cost and big volume, and the surface emitting laser (VCSEL) has the disadvantages of the low laser power and the useable wave length is limited.

FIG. 1A shows a laser diode module 70 disclosed in U.S. Pat. No. 7,177,333. The laser diode module 70 includes a heat sink 71 a plurality of first pins 72a, second pins 72b as the ground, and third pins (not shown); a first mount base 73 disposed on the heat sink 71 and connected with the second pins 72b; a second mount base 731 disposed at an inner side of the first mount base 73 for a laser diode chip 74 to be embedded thereon; a photo diode chip 75 embedded on the heat sink 71; a metal housing 77 covering on the heat sink 71 with a glass window 771 at a top surface thereof; an APC circuit 76 that has an automatic power control circuit made into a circuit board or integrated circuit and is disposed inside the metal housing 77. The first pins 72a, second pins 72b and the third pins are connected with the laser diode chip 74 and the photo diode chip 75 to form a voltage driving element for the laser diode module 70. FIG. 1B further illustrates the APC circuit 76 disposed inside the laser diode module 70, where VCC is the first pin 72a, GND is the second pin 72b and an external variable resistor (VR) 79 is the third pin.

FIG. 2A is another laser diode module 80 disclosed in U.S. Pat. No. 7,177,331. The laser diode module 80 includes a heat sink 81 with a plurality of pins 82 arranged at a rear thereof, a first mount base 811 disposed on the heat sink 81, a second mount base 812 disposed on the first mount base 811, a laser diode chip 83 embedded on the second mount base 812, a photo diode chip 84 embedded on the heat sink 81, and a metal housing 85 covering on the heat sink 81. The laser diode module 80 has a circuit with high-frequency current removing light noises from the laser diode module 80 integrated into a high-frequency modulation IC 86, and the high-frequency modulation IC 86 is encapsulated in the metal housing 85 and then electrically connected to the pins 82 and the laser diode chip 83. The pins 82 includes a first pin 82a, a second pin 82b, a third pin (not shown), and a fourth pin 82d. In FIG. 2B, the first pin 82a is the positive electrode of the laser diode chip 83, connected to an APC circuit 88; the second pin 82b is the negative electrode of the high-frequency modulation IC 86, laser diode chip 83, and the photo diode chip 84, connecting to the ground; the third pin is the positive electrode of the high-frequency modulation IC 86; and the fourth pin 82d is the positive electrode of the photo diode chip 84 connecting to the APC circuit 88.

As FIG. 3 showing, the Taiwan patent No. 1303505 disclose a surface-emitting laser 90 comprising: a n type dopant gallium arsenide (GaAs) substrate 91, a first n type dopant mirror structure 92 formed on the GaAs substrate 91; a bottom cladding layer 93 deposit at the first n type mirror structure 92; an active layer 94 formed on the bottom cladding layer 93; a top cladding layer 95 formed on the active layer 94; a second n type mirror structure 96 formed on the top cladding layer 95, on the second n type mirror structure 96 formed a p type electrode 97, and at the bottom of the substrate 91 formed a n type electrode 98.

The conventional TO-CAN package laser diode 70, 80 has the disadvantages of high cost and big volume; and the surface emitting laser (VCSEL) has the disadvantages of the low laser power and the useable wavelength is limited.

SUMMARY OF THE INVENTION

A primary objective of the present invention is to provide a laser module that integrates the edge emitting laser component, the reflecting component, and the laser receiving module on a loading board, and the edge emitting laser component and the reflecting component forms a laser emitting module, and further having the effect of minimizing the size of the laser module.

Another objective of the present invention is to provide a laser module that directly arrange the edge emitting laser component and the reflecting component on the loading board for emitting the laser beam vertically on the loading board to solve the problems above mentioned in TO-CAN package laser diode and the surface emitting laser, and further having the effects of narrowing the volume and increasing the selections of the wavelength and the laser power.

Another objective of the present invention is to provide a laser module that has the laser emitting module and the laser receiving module encapsulated on a common plane surface on the loading board for minimizing the difference of the direction between the initial optical axis to solve the problems of high assembly cost and time consuming in prior art; since the laser emitting module and laser receiving module in prior art are two independent and unrelated module and the differences of the direction between the two initial optical axis are large, they require adjustment individually, and increase the cost, the present invention further has the effects of easily adjusting the optical axis to make them parallel to each other, time saving, and reducing the cost.

To achieve the objective mentioned above, the present invention comprises: a loading board; an edge emitting laser component arranged on the loading board, and the edge emitting laser component emits a first laser beam; a reflecting component arranged in front of the edge emitting laser component on the loading board for the first laser beam to be reflected vertically, and the edge emitting laser component and reflecting component become a laser emitting module; and a laser receiving module arranged closed to the edge emitting laser component on the loading board to receive the first laser beam reflected from above.

Also, further comprising a case body for covering the loading board and having a first opening hole and a second opening hole, and the first opening hole is located corresponding to the position of the reflecting component, and the second opening hole is located corresponding to the position of the laser receiving module.

Also, further comprising a first lens and a second lens, they are arranged inside the case body corresponding to the position of the first opening hole and the second opening hole.

Also, further comprising a housing arranged between the loading board and the case body and having a first through-hole and a second through-hole, the first through-hole is corresponded to the first opening hole, the second through-hole is corresponded to the second opening hole, the reflecting component and the edge emitting laser component is inside the first through-hole, and the laser receiving module is inside the second through-hole.

Also, wherein the case body having an optical guiding slot opened upward and a first container opened downward, the first container is arranged below the optical guiding slot for the first lens to be fixed inside the first container, and the first opening hole is penetrated from the bottom of the optical guiding slot to the bottom of the first container for the first laser beam reflected by the reflecting component to go through the first through-hole, the first container, the first lens, the first opening hole, and the optical guiding slot to the predetermination and then reflect; the case body having a second container opened upward, the second container is arranged next to the first container for the second lens to be fixed inside the second container, and the second opening hole is penetrated to the bottom of the second container for the reflected first laser beam to go through the second container, the second opening hole, and the second through-hole to the laser receiving module.

Also, further comprising a substrate arranged between the loading board and the edge emitting laser component.

Also, wherein the edge emitting laser component having a connecting surface and the substrate having a top surface, and the connecting surface of the edge emitting laser component is connected to the top surface.

Also, wherein further comprising a photodiode chip arranged on the substrate and having a detection surface for the detection surface to share a common plane surface with the connecting surface of the edge emitting laser component and the top surface of the substrate, and the photodiode chip coupled with the edge emitting laser component and the substrate; an automatic power control IC having a first surface arranged on the substrate for the first surface to share a common plane surface with the connecting surface the edge emitting laser component, the top surface of the substrate, and the detection surface of the photodiode chip for the automatic power control IC to be coupled with the edge emitting laser component, the substrate, and the photodiode chip.

Also, wherein the edge emitting laser component has a negative electrode layer and a positive electrode layer, the positive electrode layer including a ridge section, and has a first end and a second end respectively emitting the first laser beam and a second laser beam, the edge emitting laser component disposed partially on the substrate for the first end to remain out of contact from the top surface of the substrate, thereby avoiding the first laser beam from being emitted to the top surface, and for the second end to be close to the detection surface of the photodiode chip, thereby emitting the second laser beam to the detection surface for operation; whereby upon the detection surface of the photodiode chip detecting a power range of the second laser beam, the automatic power control integrated circuit adjusts a power range of the first laser beam accordingly.

Also, further comprising a high-frequency modulation integrated circuit arranged on the substrate and including a second surface for the second surface to share a common plane surface with the connecting surface of the edge emitting laser, the top surface of the substrate, the detection surface of the photodiode chip, and the first surface of the automatic power control integrated circuit component for the high-frequency modulation integrated circuit to be coupled with the edge emitting laser component, the substrate, the photodiode chip, and the automatic power control integrated circuit.

With structures disclosed above, the present invention integrates the edge emitting laser component, the reflecting component, and the laser receiving module on a loading board, also the edge emitting laser component and the reflecting component forms a laser emitting module, also, arranging the edge emitting laser component and the reflecting component on the loading board for emitting the laser beam vertically on the loading board, and the laser emitting module and the laser receiving module encapsulated on common plane surface on the loading board for minimizing the difference of the direction between the initial optical axis, further has the effects of easily adjusting the optical axis to make optical axis parallel to each other, time saving, reducing the cost, minimizing the volume of the module, and having more useable selection of the wavelength.

DETAILED DESCRIPTION OF THE PREFERRED EMBODIMENT

Figure 1A:
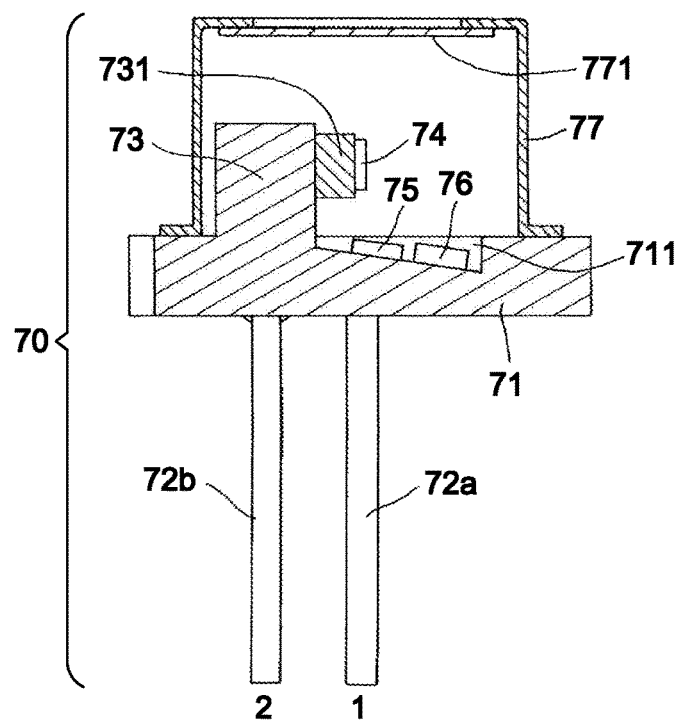
FIG. 1A is a schematic diagram of the conventional TO-CAN package laser diode.
Figure 1B:
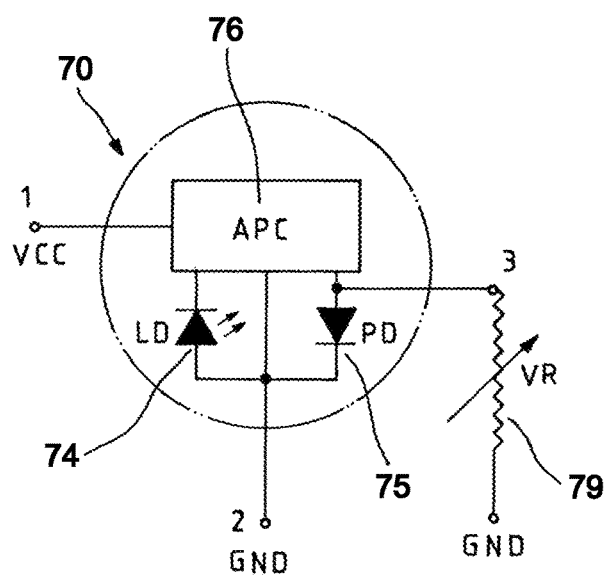
FIG. 1B is a circuit diagram of the conventional TO-CAN package laser diode in FIG. 1A.
Figure 2A:
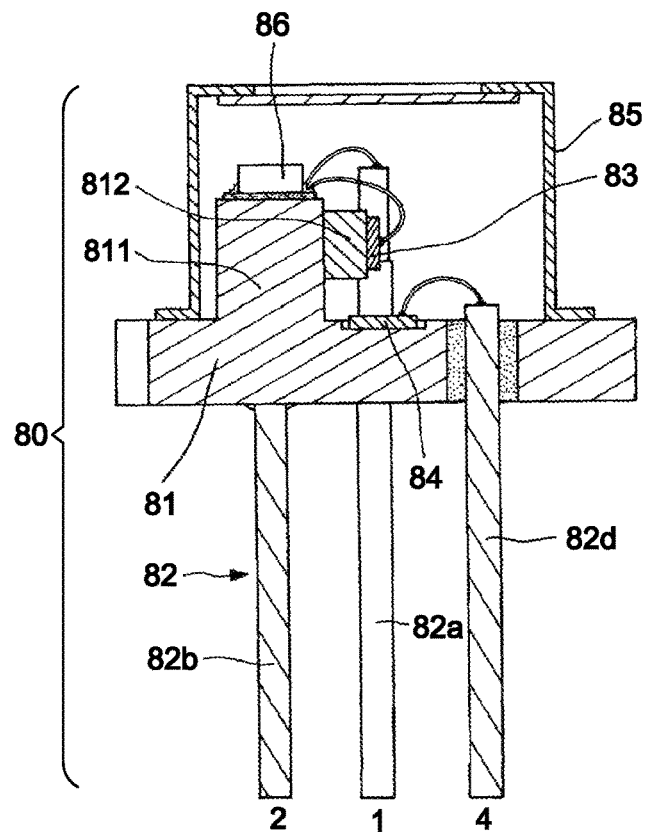
FIG. 2A is a schematic diagram of another conventional TO-CAN package laser diode.
Figure 2B:
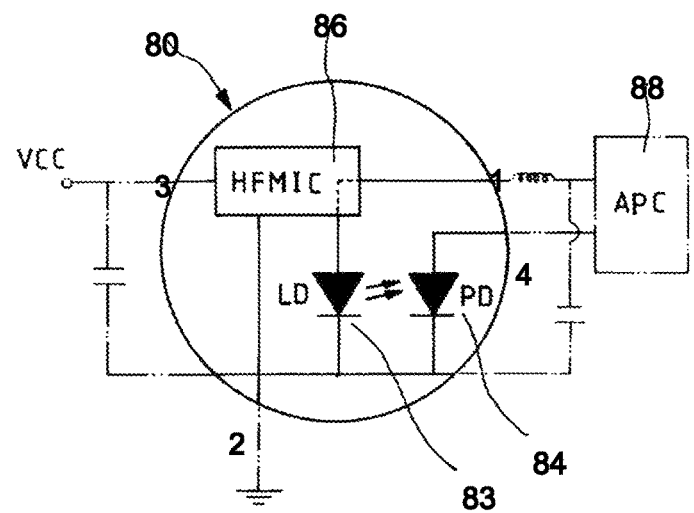
FIG. 2B is a circuit diagram of the conventional TO-CAN package laser diode in FIG. 2A.
Figure 3:
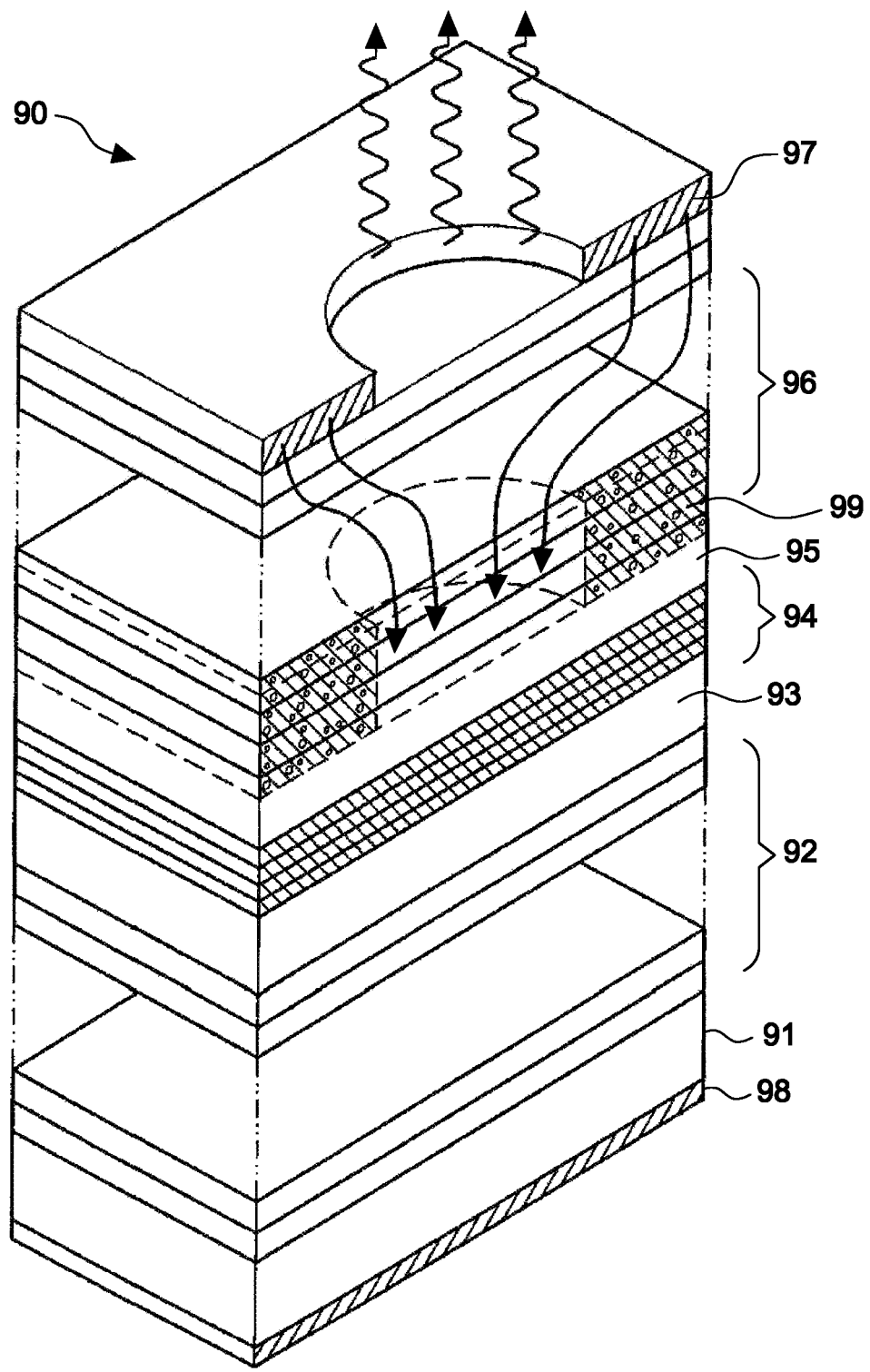
FIG. 3 is a schematic diagram of the conventional surface emitting laser.
Figure 4:
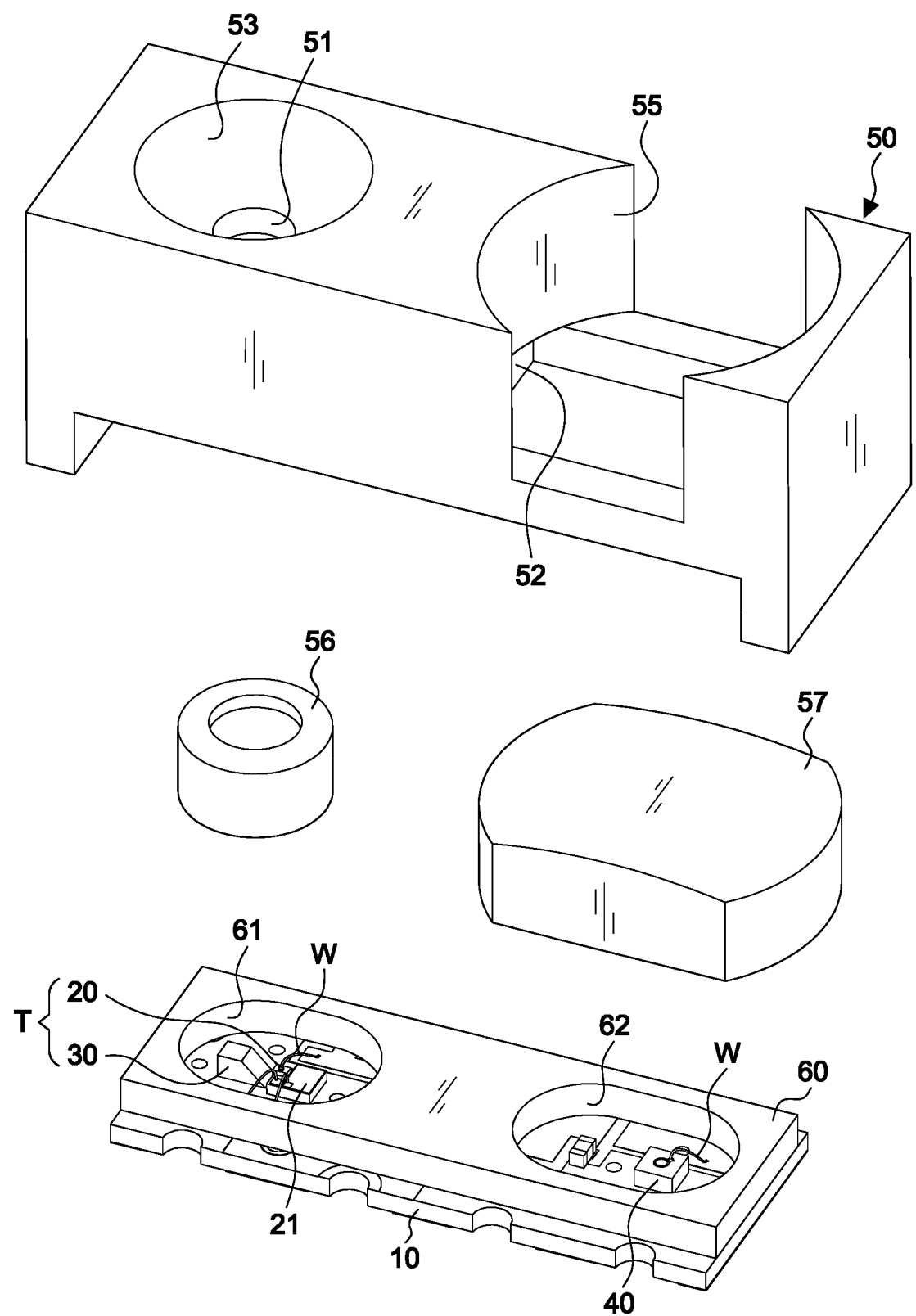
FIG. 4 is an exploded perspective view of the present invention.
Figure 5:
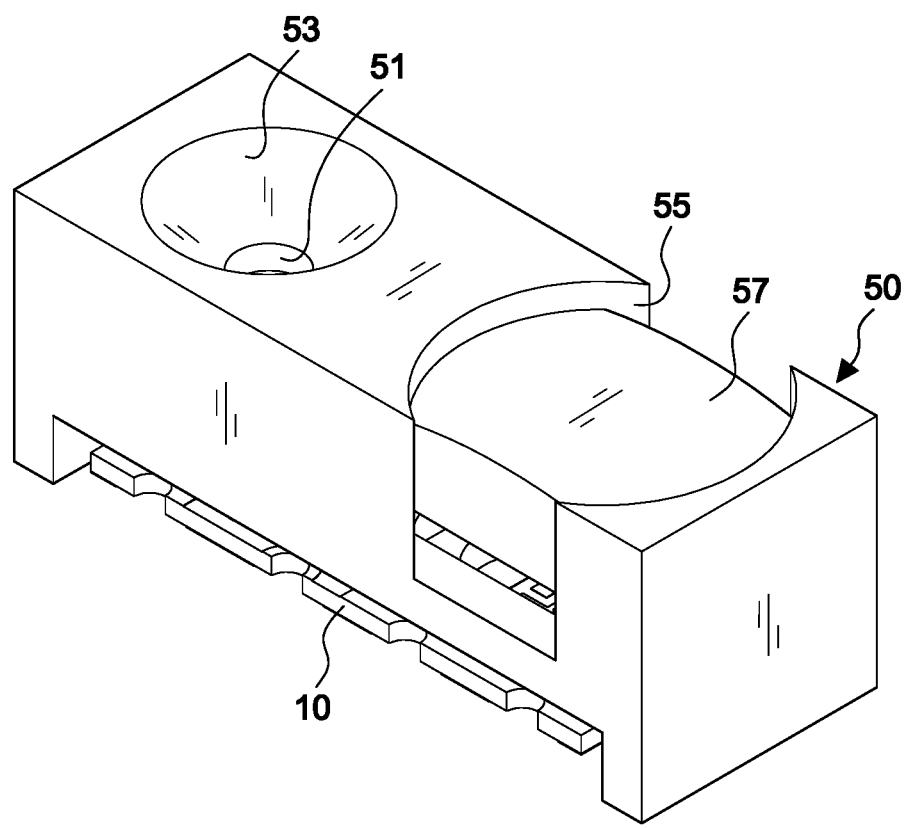
FIG. 5 is an assembly perspective view of the present invention.
Figure 6:
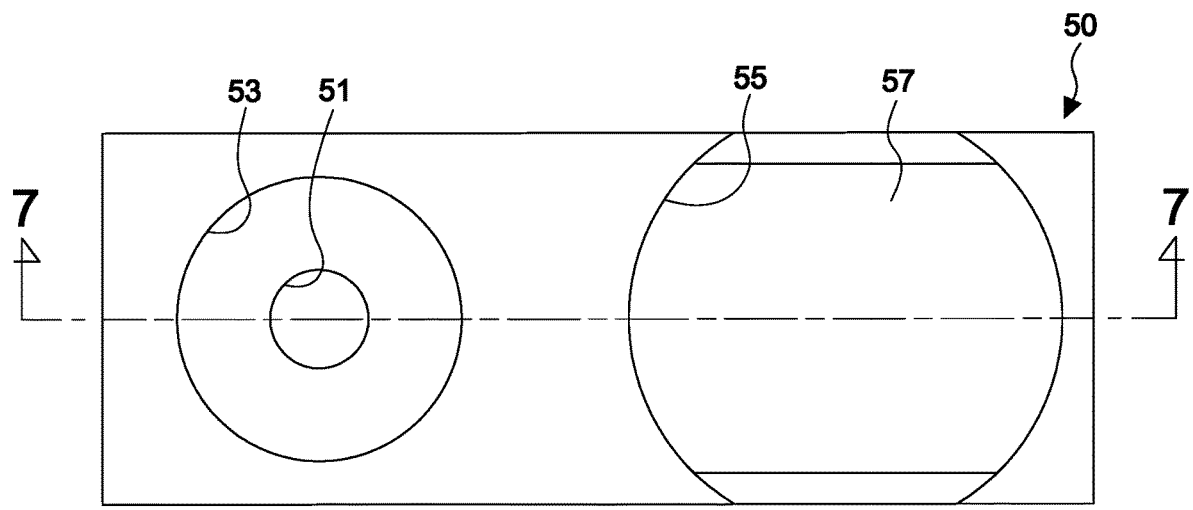
FIG. 6 is a top view of the present invention.
Figure 7:
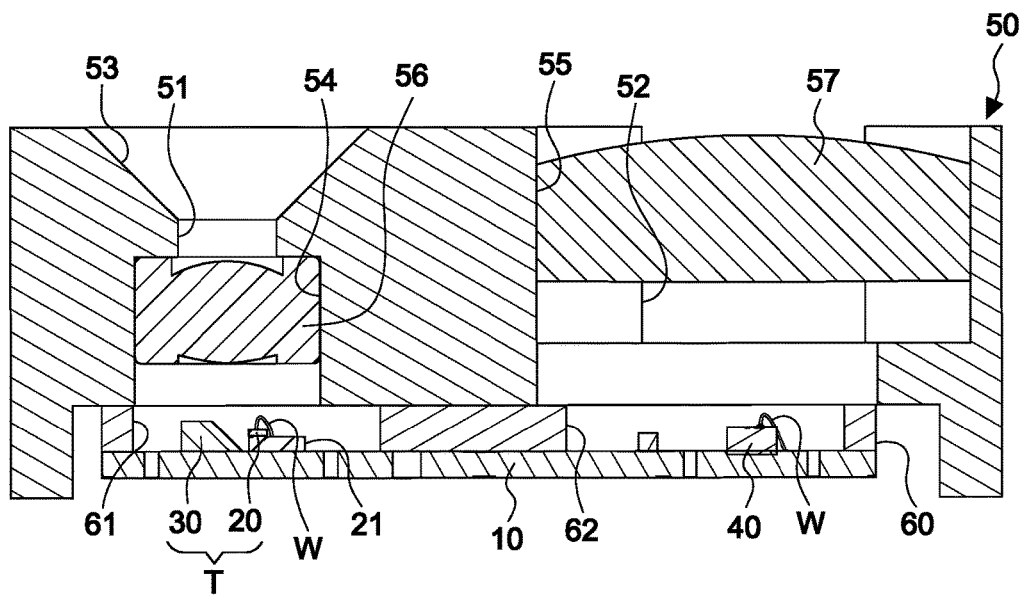
FIG. 7 is a sectional view along line 7-7 in FIG. 6.

Referring to FIGS. 4-8, a preferred embodiment of the present invention mainly comprises a loading board 10, in this embodiment, the loading board 10 can be circuit board or ceramic board. But the present invention is not limited to such application.

An edge emitting laser component 20 arranged on the loading board 10, and the edge emitting laser component 20 emits a first laser beam L1, in this embodiment, the edge emitting laser component 20 is coupled with the loading board 10 by electric wire W. But the present invention is not limited to such application. Also, further comprising a substrate 21 arranged between the edge emitting laser component 20 and the loading board 10, the substrate 21 is not necessary component, in this embodiment, the substrate 21 is coupled with the loading board 10 by electric wire W. But the present invention is not limited to such application.

A reflecting component 30 arranged in front of the edge emitting laser component 20 on the loading board 10 for the first laser beam L1 to be reflected vertically, and the edge emitting laser component 20 and reflecting component 30 become a laser emitting module T, in this embodiment, reflecting component 30 can be fixed on the loading board 10 for the first laser beam L1 of the edge emitting laser component 20 to be reflected to the predetermination O and to provide a laser distance D. But the present invention is not limited to such application.

A laser receiving module 40 arranged closed to the edge emitting laser component 20 on the loading board 10 to receive the second laser beam L2 reflected from above, in this embodiment, the laser receiving module 40 is coupled with the loading board 10 by electric wire W. But the present invention is not limited to such application.

Also, in this embodiment, further comprising a case body 50 for covering the loading board 10 and having a first opening hole 51 and a second opening hole 52, and the first opening hole 51 is located corresponding to the position of the reflecting component 30, and the second opening hole 52 is located corresponding to the position of the laser receiving module 40; further comprising a first lens 56 and a second lens 57, they are arranged inside the case body 50 corresponding to the position of the first opening hole 51 and the second opening hole 52; further comprising a housing 60 arranged between the loading board 10 and the case body 50 and having a first through-hole 61 and a second through-hole 62, the first through-hole 61 is corresponded to the first opening hole 51, the second through-hole 62 is corresponded to the second opening hole 52, the reflecting component 30 and the edge emitting laser component 20 is inside the first through-hole 61, and the laser receiving module 40 is inside the second through-hole 62. But the present invention is not limited to such application.

Figure 8:
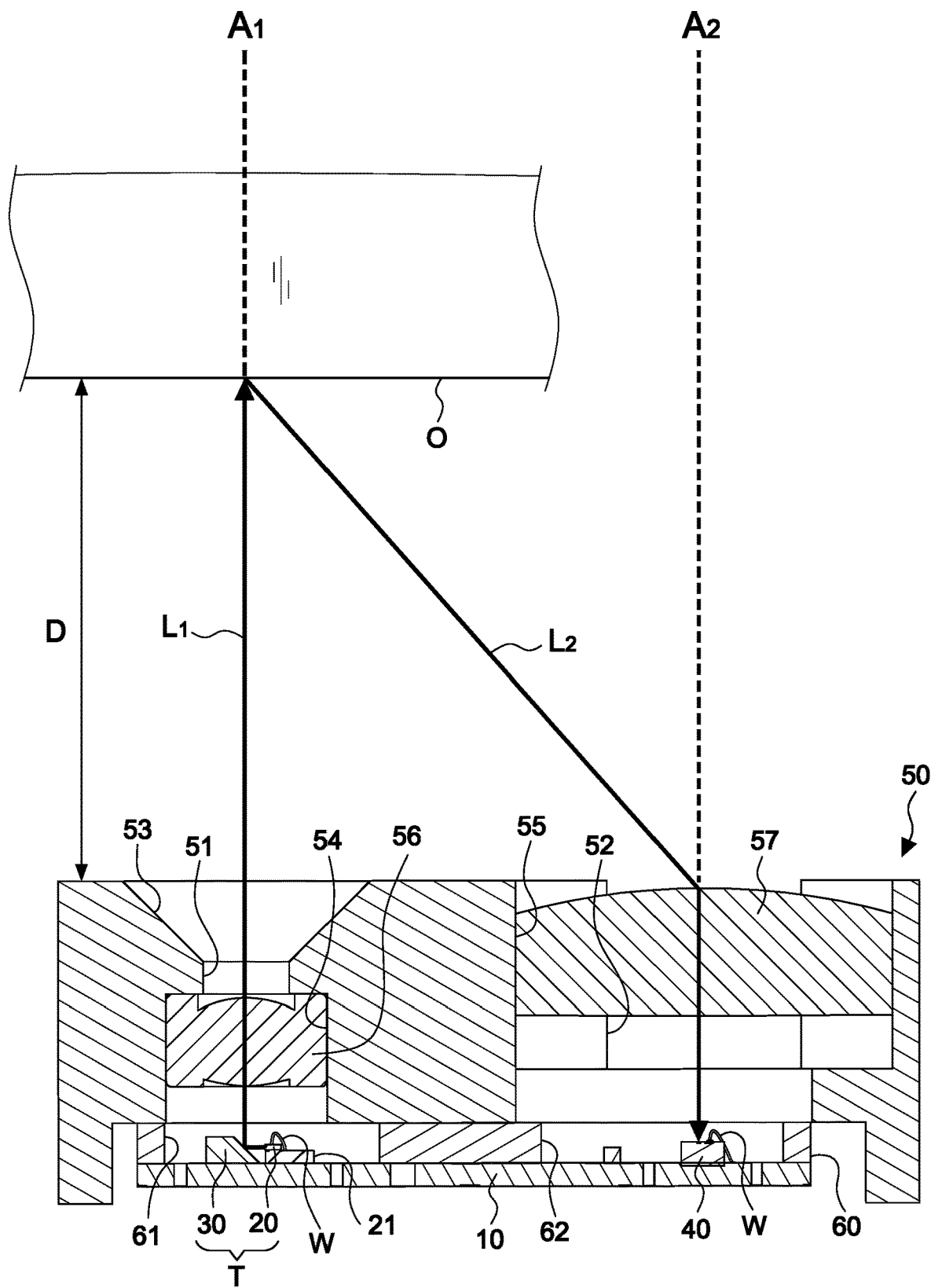
FIG. 8 is a schematic diagram illustrating the operation of the present invention.
Figure 9A:
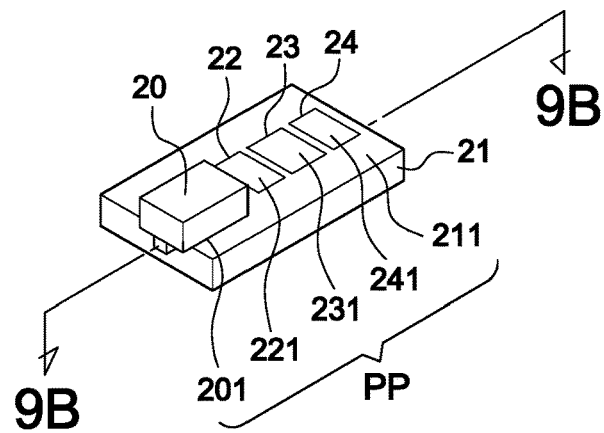
FIG. 9A is a perspective view of the common plane surface of the present invention shared by the connecting surface, the top surface, the detection surface, the first surface, and the second surface.
Figure 9B:
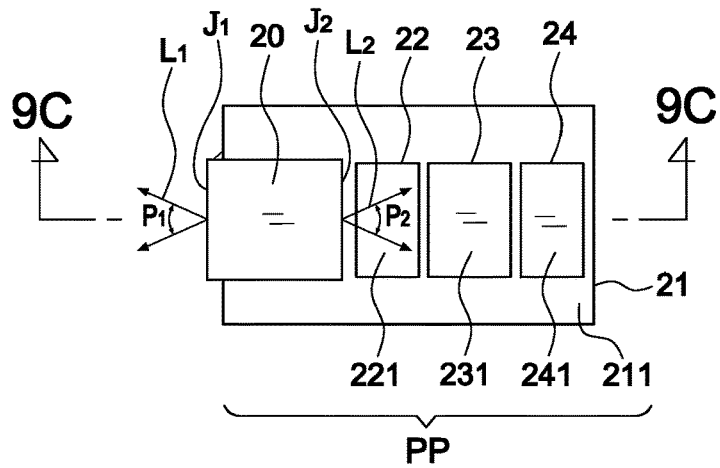
FIG. 9B is a sectional view along line 9B-9B in FIG. 9A.
Figure 9C:
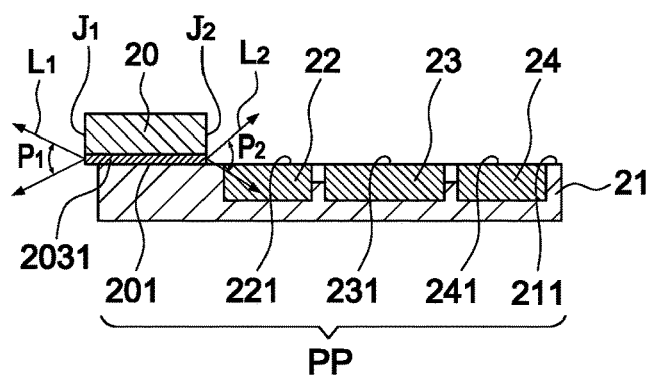
FIG. 9C is a sectional view along line 9C-9C in FIG. 9B.
Figure 9D:
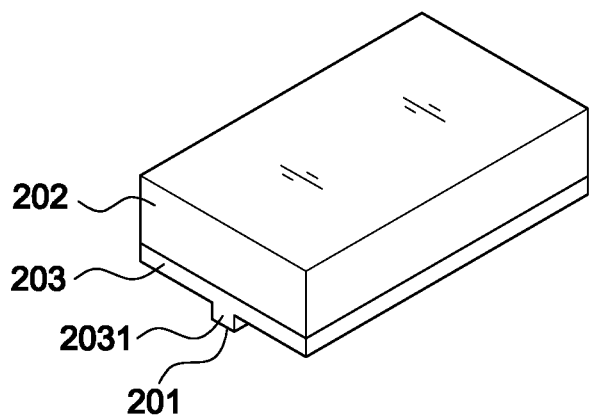
FIG. 9D is a perspective view of the edge emitting laser component of the present invention.
Figure 9E:
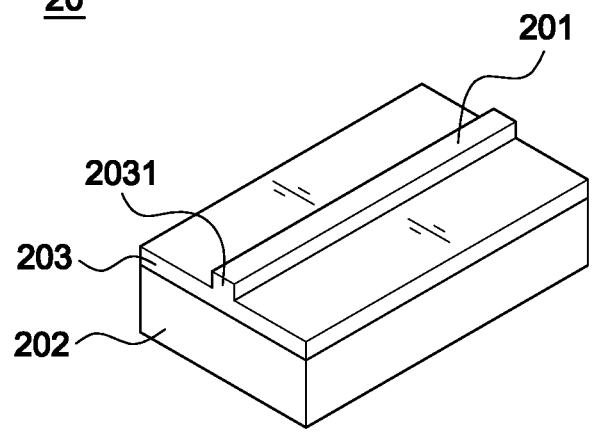
FIG. 9E is another perspective view of the edge emitting laser component of the present invention.

Referring to FIG. 8, in this embodiment, the case body 50 having an optical guiding slot 53 opened upward and a first container 54 opened downward, the first container 54 is arranged below the optical guiding slot 53 for the first lens 56 to be fixed inside the first container 54, and the first opening hole 51 is penetrated from the bottom of the optical guiding slot 53 to the bottom of the first container 54 for the first laser beam L1 reflected by the reflecting component 30 to go through the first through-hole 61, the first container 54, the first lens 56, the first opening hole 51, and the optical guiding slot 53 to the predetermination O and then reflect; the case body 50 having a second container 55 opened upward, the second container 55 is arranged next to the first container 54 for the second lens 57 to be fixed inside the second container 54, and the second opening hole 52 is penetrated to the bottom of the second container 54 for the reflected first laser beam L1 to go through the second container 54, the second opening hole 52, and the second through-hole 62 to the laser receiving module 40, and the laser emitting module T extends an emitting optical axis A1 and the laser receiving module 40 extends a receiving optical axis A2, whereby arranging the laser emitting module T and the laser receiving module 40 on the common loading board 10, so the emitting optical axis A1 and the receiving optical axis A2 is easy to adjust to be parallel to each other.

Base on the features disclosed above, the present invention integrates the edge emitting laser component 20, the reflecting component 30, and the laser receiving module 40 on a loading board 10, and the edge emitting laser component 20 and the reflecting component 30 forms a laser emitting module T, and further directly arrange the edge emitting laser component 20 and the reflecting component 30 on the loading board 10 for emitting the laser beam L1 vertically on the loading board 10, then the laser emitting module T and the laser receiving module 40 encapsulated on a common plane surface on the loading board 10 for minimizing the difference of the direction between the initial optical axis(A1, A2), further has the effects of easily adjusting the optical axis (A1, A2) to make them parallel to each other, time saving, reducing the cost, minimizing the volume of the module, and having more useable selections of the wavelength.

Also, referring to FIGS. 9A-9E, in this embodiment, the edge emitting laser component 20 having a connecting surface 201 and the substrate 21 having a top surface 211, and the connecting surface 201 of the edge emitting laser component 20 is connected to the top surface 211. Further comprising a photodiode chip 22 arranged on the substrate 21 and having a detection surface 221 for the detection surface 221 to share a common plane surface PP with the connecting surface 201 of the edge emitting laser component 20 and the top surface 211 of the substrate 21, and the photodiode chip 22 coupled with the edge emitting laser component 20 and the substrate 21; an automatic power control IC 23 having a first surface 231 arranged on the substrate 21 for the first surface 231 to share a common plane surface PP with the connecting surface 201 the edge emitting laser component 20, the top surface 211 of the substrate 21, and the detection surface 221 of the photodiode chip 22 for the automatic power control IC 23 to be coupled with the edge emitting laser component 20, the substrate 21, and the photodiode chip 22. But the present invention is not limited to such application Also, in this embodiment, the edge emitting laser component 20 has a negative electrode layer 202 and a positive electrode layer 203, the positive electrode layer 203 including a ridge section 2031, and has a first end J1 and a second end J2 respectively emitting the first laser beam L1 and a second laser beam L2, the edge emitting laser component 20 disposed partially on the substrate 21 for the first end J1 to remain out of contact from the top surface 211 of the substrate 21, thereby avoiding the first laser beam L1 from being emitted to the top surface 211, and for the second end J2 to be close to the detection surface 221 of the photodiode chip 22, thereby emitting the second laser beam L2 to the detection surface 221 for operation; whereby upon the detection surface 221 of the photodiode chip 22 detecting a power range P2 of the second laser beam L2, the automatic power control integrated circuit 23 adjusts a power range P1 of the first laser beam L1 accordingly. But the present invention is not limited to such application.

Also, in this embodiment, further comprising a high-frequency modulation integrated circuit 24 arranged on the substrate 21 and including a second surface 241 for the second surface 241 to share a common plane surface PP with the connecting surface 201 of the edge emitting laser 20, the top surface 211 of the substrate 21, the detection surface 221 of the photodiode chip 22, and the first surface 231 of the automatic power control integrated circuit component 23 for the high-frequency modulation integrated circuit 24 to be coupled with the edge emitting laser component 20, the substrate 21, the photodiode chip 22, and the automatic power control integrated circuit 23. But the present invention is not limited to such application.

Although particular embodiments of the invention have been described in detail for purposes of illustration, various modifications and enhancements may be made without departing from the spirit and scope of the invention. Accordingly, the invention is not to be limited except as by the appended claims.

What is claimed is:

1. A laser module, comprising:
   a loading board;
   an edge emitting laser component arranged on the loading board, and the edge emitting laser component emits a first laser beam;
   a reflecting component arranged in front of the edge emitting laser component on the loading board for the first laser beam to be reflected vertically, and the edge emitting laser component and the reflecting component become a laser emitting module;
   a laser receiving module arranged close to the edge emitting laser component on the loading board to receive the first laser beam reflected from above; and
   a case body for covering the loading board and having a first opening hole and a second opening hole, the first opening hole being located corresponding to the position of the reflecting component, and the second opening hole being located corresponding to the position of the laser receiving module.

2. The laser module as claimed in claim 1, further comprising a first lens and a second lens, they are arranged inside the case body corresponding to the position of the first opening hole and the second opening hole.

3. The laser module as claimed in claim 2, further comprising a housing arranged between the loading board and the case body and having a first through-hole and a second through-hole, the first through-hole is corresponded to the first opening hole, the second through-hole is corresponded to the second opening hole, the reflecting component and the edge emitting laser component are inside the first through-hole, and the laser receiving module is inside the second through-hole.

4. The laser module as claimed in claim 3, wherein the case body having an optical guiding slot opened upward and a first container opened downward, the first container is arranged below the optical guiding slot for the first lens to be fixed inside the first container, and the first opening hole is penetrated from the bottom of the optical guiding slot to the bottom of the first container for the first laser beam reflected by the reflecting component to go through the first through-hole, the first container, the first lens, the first opening hole, and the optical guiding slot to a predetermination and then reflect; the case body having a second container opened upward arranged next to the first container for the second lens to be fixed inside the second container, and the second opening hole is penetrated to the bottom of the second container for the reflected first laser beam to go through the second container, the second opening hole, and the second through-hole to the laser receiving module.

5. The laser module as claimed in claim 1, further comprising a substrate arranged between the loading board and the edge emitting laser component.

6. The laser module as claimed in claim 5, wherein the edge emitting laser component has a connecting surface and the substrate has a top surface connected to the connecting surface.

7. The laser module as claimed in claim 6, further comprising a photodiode chip arranged on the substrate and having a detection surface for the detection surface to share a common plane surface with the connecting surface of the edge emitting laser component and the top surface of the substrate, and the photodiode chip being coupled with the edge emitting laser component and the substrate; and an automatic power control IC having a first surface arranged on the substrate for the first surface to share a common plane surface with the connecting surface the edge emitting laser component, the top surface of the substrate, and the detection surface of the photodiode chip for the automatic power control IC to be coupled with the edge emitting laser component, the substrate, and the photodiode chip.

8. The laser module as claimed in claim 7, wherein the edge emitting laser component has a negative electrode layer and a positive electrode layer, the positive electrode layer including a ridge section, and has a first end and a second end respectively emitting the first laser beam and a second laser beam, the edge emitting laser component disposed partially on the substrate for the first end to remain out of contact from the top surface of the substrate, thereby avoiding the first laser beam from being emitted to the top surface, and for the second end to be close to the detection surface of the photodiode chip, thereby emitting the second laser beam to the detection surface for operation; whereby upon the detection surface of the photodiode chip detecting a power range of the second laser beam, the automatic power control integrated circuit adjusts a power range of the first laser beam accordingly.

9. The laser module as claimed in claim 7, further comprising a high-frequency modulation integrated circuit arranged on the substrate and including a second surface for the second surface to share a common plane surface with the connecting surface of the edge emitting laser, the top surface of the substrate, the detection surface of the photodiode chip, and the first surface of the automatic power control integrated circuit component for the high-frequency modulation integrated circuit to be coupled with the edge emitting laser component, the substrate, the photodiode chip, and the automatic power control integrated circuit.

10. A laser module, comprising:
    a loading board;
    an edge emitting laser component arranged on the loading board and having a connecting surface, and the edge emitting laser component emits a first laser beam;
    a reflecting component arranged in front of the edge emitting laser component on the loading board for the first laser beam to be reflected vertically, and the edge emitting laser component and the reflecting component become a laser emitting module;
    a laser receiving module arranged close to the edge emitting laser component on the loading board to receive the first laser beam reflected from above;
    a substrate arranged between the loading board and the edge emitting laser component, the substrate having a top surface connected to the connecting surface of the edge emitting laser component;
    a photodiode chip arranged on the substrate and having a detection surface for the detection surface to share a common plane surface with the connecting surface of the edge emitting laser component and the top surface of the substrate, and the photodiode chip being coupled with the edge emitting laser component and the substrate; and
    an automatic power control IC having a first surface arranged on the substrate for the first surface to share a common plane surface with the connecting surface of the edge emitting laser component, the top surface of the substrate, and the detection surface of the photodiode chip for the automatic power control IC to be coupled with the edge emitting laser component, the substrate, and the photodiode chip.

* * * * *